United States Patent [19]

Matsushita

[11] Patent Number: 5,220,191

[45] Date of Patent: Jun. 15, 1993

[54] SEMICONDUCTOR DEVICE HAVING A WELL ELECTRICALLY INSULATED FROM THE SUBSTRATE

[75] Inventor: Yoshiaki Matsushita, Yokohama, Japan

[73] Assignee: Kabushiki Kaisha Toshiba, Kawasaki, Japan

[21] Appl. No.: 753,043

[22] Filed: Aug. 30, 1991

[30] Foreign Application Priority Data

Aug. 30, 1990 [JP] Japan ................................. 2-228932
Jul. 1, 1991 [JP] Japan ................................. 3-185816

[51] Int. Cl.⁵ .................... H01L 27/02; H01L 29/167
[52] U.S. Cl. ................................... 257/499; 257/368; 257/369; 257/379; 257/610
[58] Field of Search ................ 357/47, 41, 42, 51, 357/63; 257/499, 368, 369, 379, 610, 611

[56] References Cited

U.S. PATENT DOCUMENTS 4,970,568 11/1990 Hiraguchi et al. ................... 357/42
5,065,212 11/1991 Ohata et al. ........................ 357/42

Primary Examiner—Mark V. Prenty
Attorney, Agent, or Firm—Foley & Lardner

[57] ABSTRACT

The semiconductor device comprises a semiconductor substrate 11; a semiconductor layer 12 different in conductivity type from and lower in oxygen concentration than the semiconductor substrate, and formed uniformly on the substrate; a well region 13 different in conductivity type from the semiconductor layer and formed into an island shape in the semiconductor layer so that the bottom surface thereof is 1 to 20 μm away from the surface of the substrate; and both or either of a MOS transistor or a capacitance formed in the semiconductor layer or the well region so as to be electrically insulated from the substrate.

6 Claims, 7 Drawing Sheets

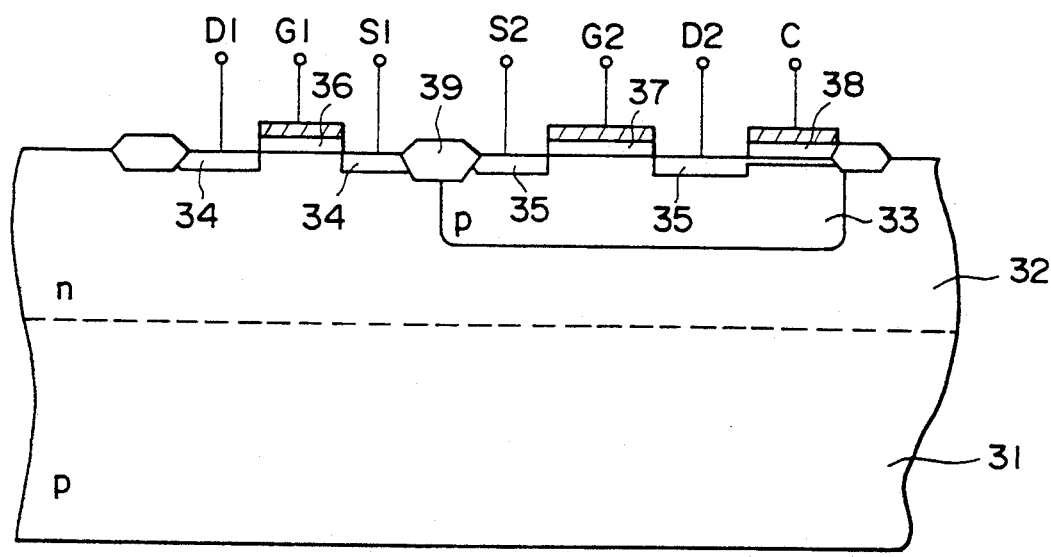
F I G. 3

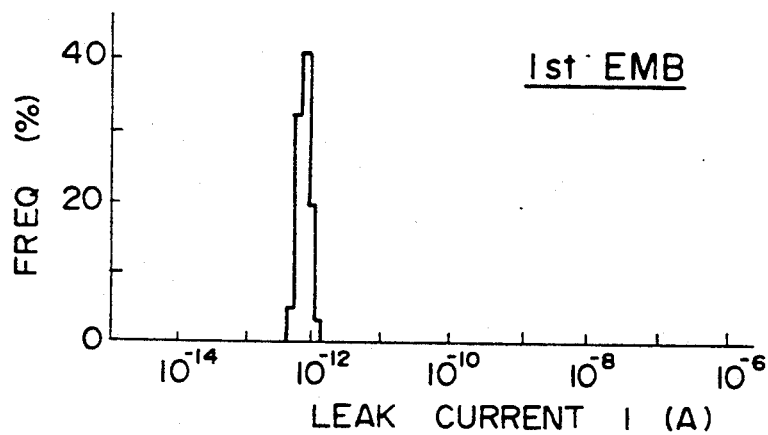
F I G. 4(A)
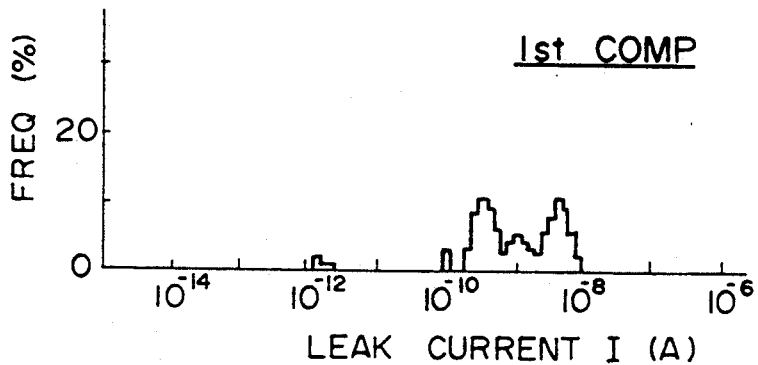
F I G. 4(B)
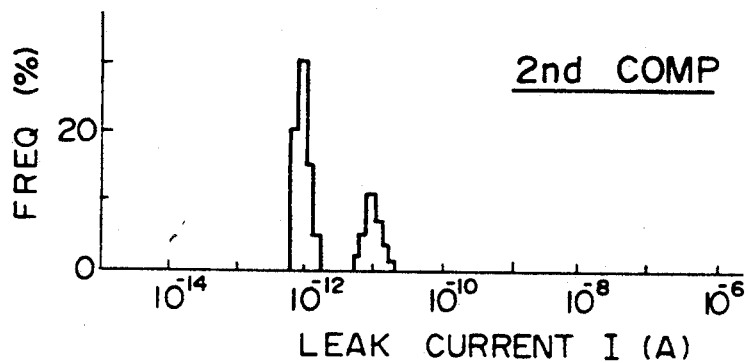
F I G. 4(C)

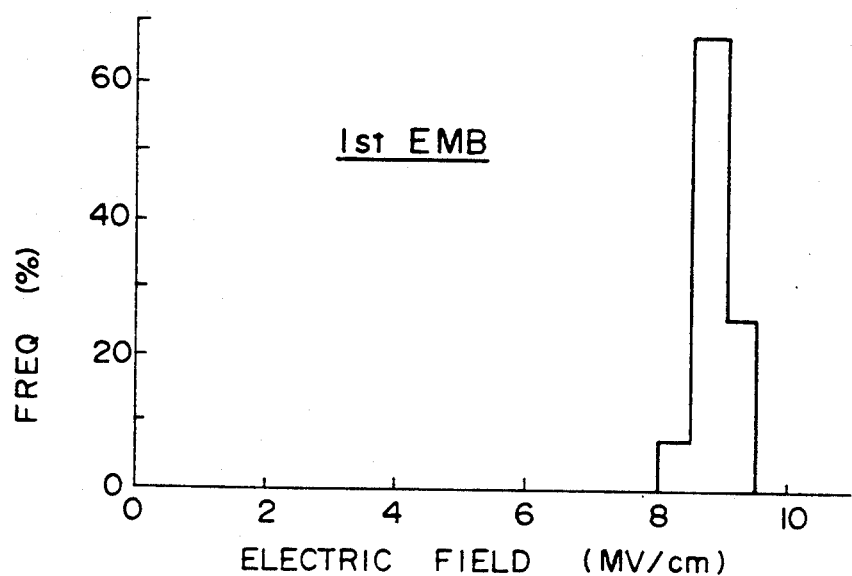
F I G. 5(A)
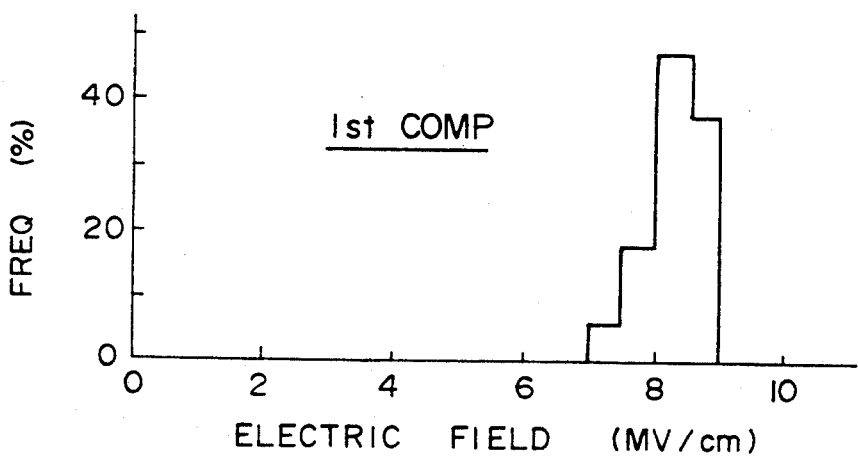
F I G. 5(B)
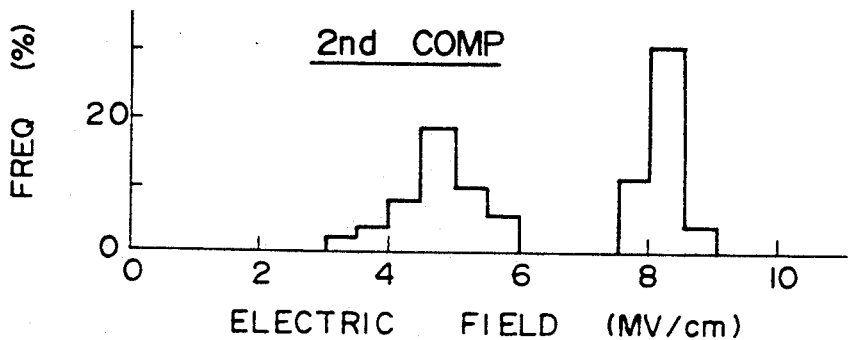
F I G. 5(C)

SEMICONDUCTOR DEVICE HAVING A WELL ELECTRICALLY INSULATED FROM THE SUBSTRATE

BACKGROUND OF THE INVENTION

The present invention relates to a semiconductor device having a substrate almost free from crystal defects and oxide film defects on the surface area thereof on which elements are formed, and a manufacturing method for the device.

FIG. 10 shows a substrate structure of a prior-art high-density integrated (i.e. ULSI) CMOS device. In the drawing, an island-shaped p-type well (diffusion region) 102 is formed on the surface area of an n-type semiconductor substrate 101 having a uniform resistance. Areas at which each element is formed are isolated from each other by a field oxide films 108. On the surface of the n-type semiconductor substrate 101, a gate oxide film 105 and a gate electrode G1 are formed, and, furthermore, a $p^+$-type impurity layer 103 is formed on both sides of the gate oxide 105 and connected to a drain electrode D1 and a source electrode S1, respectively, so that a P-channel MOS-type field effect transistor (referred to as P-channel MOS transistor, hereinafter) is constructed. On the other hand, on the surface of the p-type well 102, a gate oxide film 106 and a gate electrode G2, and a capacitor oxide film 107 and a capacitor electrode C are provided. In addition, an $n^+$-type impurity layer 104 is formed and connected to a source electrode S2 and a drain electrode D2, so that an N-channel MOS transistor and a capacitance are constructed.

With the advance of microminiaturization of semiconductor devices, however, there exists the tendency that crystal defects are introduced at pattern edge portions or gate oxide film defects (e.g. microdefects in gate oxide films) are introduced in MOS transistors. In case crystal defects exist at pattern edges, there arises problems in that junction leaks occur or the data holding time duration is shortened (in the case of a semiconductor memory device) or the production yield is reduced markedly. Furthermore, in case defects exist in a gate oxide film, malfunctions occur in the MOS transistor so that data cannot be held or the production yield is also reduced. The above-mentioned introduction of crystal defects is caused by supersaturated oxygen included in the silicon wafer in the form of solid solution. Therefore, it is necessary to reduce the oxygen concentration in the surface area of the substrate where elements are formed, in order to suppress the occurrence of crystal defects. That is, if the oxygen concentration is $3 \times 10^{17}$ cm$^{-3}$ or less, crystal defects and oxide film defects can be perfectly suppressed. On the other hand, as semiconductor substrates including supersaturation oxygen therewithin and having a $3 \times 10^{17}$ cm$^{-3}$ or less oxygen concentration at the surface area thereof, there exist an intrinsic gettering (IG) wafer, an epitaxial wafer, etc. In the case of the IG wafer, however, it is difficult to always maintain the oxygen concentration at $3 \times 10^{17}$ cm$^{-3}$ or less because the oxygen concentration is dependent upon treatment conditions and wafer properties. In the case of the epitaxial wafer, there exists another problem in that the substrate is polluted during epitaxial growth or the formed epitaxial layer includes defects. Accordingly, when micro-CMOS devices are manufactured by use of these wafers, there exists a problem in that junction leak occurs. As described above, conventionally, it has been difficult to reduce the oxygen concentration on the surface area of the substrate and to suppress the junction leak.

SUMMARY OF THE INVENTION

Accordingly, the object of the present invention is to provide a semiconductor device that has an excellent crystal quality in the device active layer so that highly reliable microdevices can be formed, and a manufacturing method therefor.

The semiconductor device according to the present invention comprises a semiconductor substrate; a semiconductor layer different in conductivity type from that of said semiconductor substrate, lower in oxygen concentration than said semiconductor substrate, and formed uniformly on said semiconductor substrate; a well region different in conductivity type from that of said semiconductor layer and formed into an island shape in said semiconductor layer so that a bottom surface thereof is 1 to 20 μm away from a surface of said semiconductor substrate; and both or either of a MOS-type field effect transistor or a capacitance formed in said semiconductor layer or said well region so as to be electrically insulated from said semiconductor substrate.

The oxygen concentration of said semiconductor substrate lies within a range from $8 \times 10^{17}$ to $12 \times 10^{17}$ cm$^{-3}$, and that of said semiconductor layer is $3 \times 10^{17}$ cm$^{-3}$ or less. The semiconductor layer is an epitaxial growth layer (referred to as epitaxial layer, hereinafter), and the thickness thereof is less than 30 μm. The impurity concentration of said semiconductor substrate lies within a range from $1 \times 10^{14}$ to $5 \times 10^{18}$ cm$^{-3}$. The junction depth of said well region lies within a range from 1 to 8 μm.

Furthermore, the method of manufacturing a semiconductor device according to the present invention comprises the steps of: heat-treating a surface of a semiconductor substrate within a reducing atmosphere; diffusing impurities on the surface area of the heat-treated semiconductor substrate, to form a semiconductor layer of a conductivity type different from that of the semiconductor substrate; forming a well region of a conductivity type different from that of the semiconductor layer, in the semiconductor layer; and forming both or either of a MOS type field effect transistor or a capacitance in the semiconductor layer or the well region. Furthermore, the other method of manufacturing a semiconductor device according to the present invention comprises the steps of: joining a high oxygen concentration semiconductor substrate and a low oxygen concentration ($3 \times 10^{17}$ cm$^{-3}$ or less) semiconductor substrate of a different conductivity type by overlapping junction surfaces thereof of one another; polishing the low oxygen concentration semiconductor substrates to obtain a semiconductor layer; forming a well region of a conductivity type different from that of the semiconductor layer in the semiconductor layer; and forming both or either of a MOS type field effect transistor or a capacitance in the semiconductor layer or the well region. Furthermore, in the present invention, two MOS type field effect transistors and the capacitance constitute a memory of CMOS structure.

In the device according to the present invention, since a semiconductor layer with a low oxygen concentration is formed only at an active layer on the surface of which elements are formed, it is possible to effectively reduce junction leaks. In the first aspect of the manufacturing method, an epitaxial layer is adopted. In the second aspect of the manufacturing method, the substrate is heat-treated within a reducing or inert gas atmosphere, and then dopant opposite in conductivity type to the substrate is diffused into the substrate. In the third aspect thereof, a low oxygen concentration wafer is joined with a high oxygen concentration wafer for lamination of the substrate.

BRIEF DESCRIPTION OF THE DRAWINGS

In the attached drawings:

FIG. 3 is a cross-sectional view showing the structure of a third embodiment of the semiconductor device according to the present invention;

FIGS. 4(a), (b) and (c) are characteristic diagrams showing the test results of pn junction leak distribution obtained by measuring the present invention semiconductor device against comparative examples;

FIGS. 5(a), (b) and (c) are characteristic diagrams showing the test results of oxide film voltage resistance distribution obtained by measuring the invention semiconductor device in comparison with comparative examples;

DESCRIPTION OF THE PREFERRED EMBODIMENTS

Figure 1:
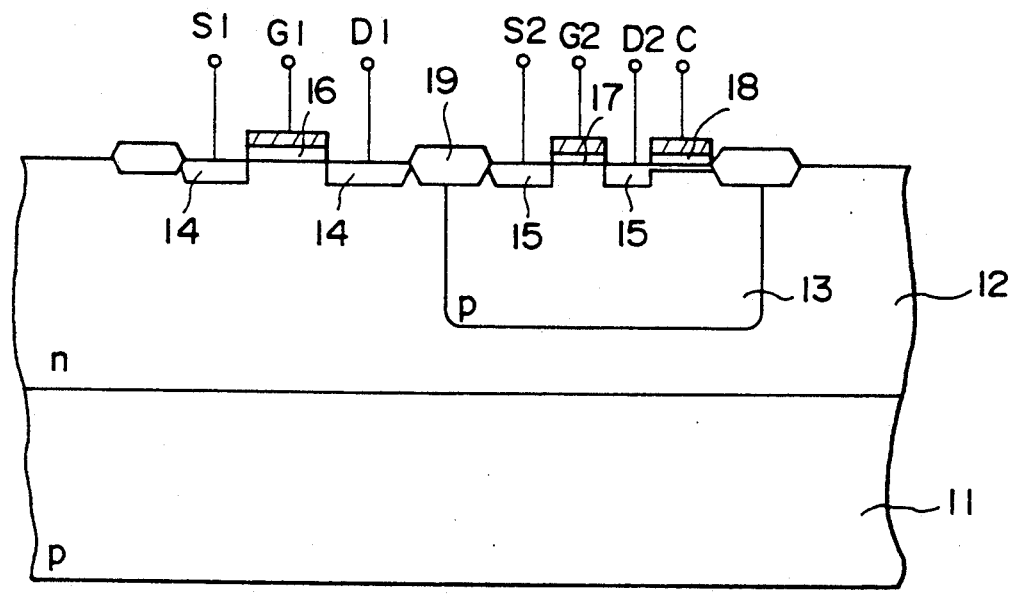
FIG. 1 is a cross-sectional view showing the structure of a first embodiment of the semiconductor device according to the present invention.

A first embodiment of the present invention will be described with reference to FIG. 1. As shown, an n-type semiconductor layer 12 is formed on the entire surface of a p-type silicon semiconductor substrate 11 in accordance with epitaxial growth method. Further, a p-type well 13 is formed into an island shape in this n-type semiconductor layer (referred to as an n-type layer,) 12, so that the device's active areas are divided into the n-type region (n-type layer) 12 and the p-type region (p-type well) 13. Furthermore, the two areas where each element is formed are separated from each other by a field oxide film 19. A gate electrode G1 is formed on the surface of the n-type layer 12 via a gate oxide film 16, and a source electrode S1 and a drain electrode D1 are connected to a $p^+$-type impurity layer 14 formed on both the sides of the gate oxide film 16, respectively, so that a P-channel MOS transistor can be constructed. On the other hand, a gate electrode G2 is formed on the surface of the p-type well 13 via a gate oxide film 17; and a capacitor electrode C is formed on the surface of the p-type well 13 via a capacitor oxide film 18. Furthermore, a source electrode S2 and a drain electrode D2 are connected to an $n^+$-type impurity layer 15, respectively, so that an N-channel MOS transistor and a capacitance can be formed. As described above, the n-type layer 12 opposite in conductivity type to the substrate 11 is formed on the surface of the semiconductor substrate 11 and further device active areas are formed on the surface area of the n-type layer 12, without directly forming device active areas on the surface of the semiconductor substrate 11, as is conventional. In the above-mentioned substrate structure, since metal impurities, which form a deep level in silicon crystal, are absorbed into the p-type semiconductor substrate 11 remote from the device active areas. Thus, the device active areas can be purified. In addition, since the n-type layer 12 in which the device active areas exist is formed by the epitaxial growth method, the oxygen concentration is reduced as low as $3 \times 10^{17}$ cm$^{-3}$ or less, so that the occurrence of crystal defects and oxide film defects can be suppressed.

The method of manufacturing the semiconductor device related to the first embodiment will be described hereinbelow. A 1 to 2 ohm-cm p-type wafer grown by a pulling method (Czochralski (CZ) method) and doped by boron (B) was adopted. A 10-μm thick n-type silicon layer was formed on the surface of the above-mentioned wafer in accordance with the epitaxial growth method by using phosphine ($PH_3$) as doping gas, dichlorosilane ($SiH_2Cl_2$) as source gas, and $H_2$ as carrier gas. A resist was applied to the surface of the wafer, and an island-shaped resist film was formed by etching. Further, boron ions (B) were implanted into the wafer at an acceleration voltage of 70 kV and a dose of $1 \times 10^{13}$ cm$^{-2}$. Furthermore, the wafer was kept at 1200° C. for 6 hours for thermal diffusion to form a p-type well. Thereafter, in accordance with the conventional MOS transistor forming method, thick field oxide films were formed locally on element separating areas, and then gate oxide film forming areas were exposed. Thereafter, gate oxide films were formed, and $p^+$- or $n^+$-type impurity layers were formed on source and drain forming areas to obtain a semiconductor device as shown in FIG. 1. In this first embodiment, if a distance between the bottom of the p-type well 13 and the surface of the p-type semiconductor substrate 11 becomes 1 μm or less, the depletion layer extending from the p-type well 13 is connected to the p-type semiconductor substrate 11 when the element is in operation, so that software error resistance is deteriorated. To overcome the above-mentioned problem, the depth of the p-type well 13 was determined to be 8 μm and the distance between the two was determined 2 μm, to completely isolate the p-type well 13 electrically from the p-type semiconductor substrate 11.

Figure 2:
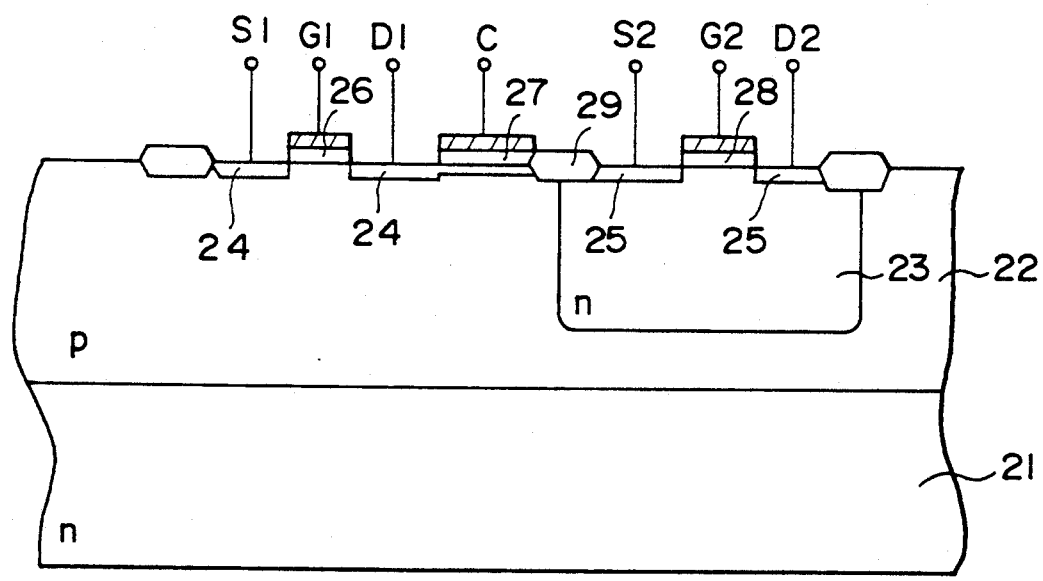
FIG. 2 is a cross-sectional view showing the structure of a second embodiment of the semiconductor device according to the present invention.

A second embodiment 2 is described with reference to FIG. 2. In this semiconductor device, shown, the conductivity types of the semiconductor substrate 21 and the semiconductor layer 22 are reversed in comparison with the semiconductor device shown in FIG. 1. In more detail, a p-type semiconductor layer (referred to as p-type layer, hereinafter) 22 is formed on the surface of an n-type semiconductor substrate 21 in accordance with the epitaxial growth method. An n-type well 23 is formed in this p-type semiconductor layer 22, so that device active areas are divided into the n-type region (n-type well) 23 and the p-type region (p-type layer) 22 in the same way as in the first embodiment shown in FIG. 1. In the p-type layer 22, a gate oxide film 26 on which a gate electrode G1 is provided, an n+-type impurity layer 24 to which a source electrode S1 and a drain electrode D1 are connected, and a capacitor oxide film 27 to which a capacitor electrode C is connected are formed, respectively to construct an N-channel MOS transistor and a capacitance. Furthermore, in the n-type well 23, a p+-type impurity layer 25 to which a gate oxide film 28 and a gate electrode G2 and further a source electrode S2 and a drain electrode D2 are connected, respectively, is formed, to construct a P-channel MOS transistor. In this device, since electrons in the n-type semiconductor substrate 21 are rebounded by the pn junction barrier between the p-type layer 22 and the n-type substrate 21 without being diffused into the p-type layer 22 on which device active areas are provided. Further, since this p-type layer 22 is formed in accordance with the epitaxial growth method, oxygen concentration can be reduced in the p-type layer 22 so that crystal defects and oxide film defects can be suppressed.

The method of manufacturing the semiconductor device related to the second embodiment will be described hereinbelow. The manufacturing process is similar to the first embodiment, except the conductivity types of the n-type semiconductor substrate 21 and the p-type layer 22 are reversed in comparison with the first embodiment. An n-type wafer grown in accordance with the CZ method was used. A 10 μm thick p-type silicon layer was formed in accordance with the epitaxial growth method by using diborane ($B_2H_6$) as doping gas and $H_2$ as carrier gas. Phosphorous ions were implanted into the wafer at an acceleration voltage of 150 kV and a dose of $2 \times 10^{13}$ cm$^{-2}$. Furthermore, the wafer was kept at 1200° C. for 10 hours for thermal diffusion to form an n-type well. Thereafter, an N-channel MOS transistor and a P-channel MOS transistor were formed. The depth of the n-type well was 8 μm.

A third embodiment will be described with reference to FIG. 3. In this semiconductor device shown in FIG. 3, the method of forming a semiconductor layer on the semiconductor substrate opposite in conductivity type to the layer is different from the first and second embodiments. In order to reduce the oxygen concentration of the region near the surface of the p-type semiconductor substrate 31, the substrate 31 is heat-treated at 1200° C. within a reducing atmosphere for 4 hours. Further, phosphorous ions are implanted into the entire surface of the substrate at an acceleration voltage of 150 kV and a dose of $2 \times 10^{13}$ cm$^{-2}$. The substrate is further kept at 1200° C. for 12 hours for thermal diffusion to obtain a 10 μm thick n-type layer 32. A 8 μm thick p-type well 33 is formed on the surface of this n-type layer 32 to separate device active areas into the n-type region (n-type layer 32) and the p-type region (p-type well 33). On the surface of the n-type layer 32, a p+-type impurity layer 34 and a gate oxide film 36 form a P-channel MOS transistor provided with a drain electrode D1, a gate electrode G1 and a source electrode S1. On the surface of the p-type well 33, an n+-type impurity layer 35, a gate oxide film 37, and a capacitor oxide film 38 are formed to construct an N-channel MOS transistor and a capacitance provided with a source electrode S2, a gate electrode G2, a drain electrode D2 and a capacitor electrode C. In this third embodiment, since the substrate is heat treated within a reducing atmosphere to form the n-type layer 32, the oxygen concentration of the layer 32 is reduced, so that the occurrence of crystal defects and oxide film defects can be depressed in the same way as in the devices shown in FIGS. 1 and 2.

A fourth embodiment is described in which a p-type semiconductor substrate and an n-type semiconductor substrate are bonded to each other to form a semiconductor wafer composed of a semiconductor substrate and a semiconductor layer of low oxygen concentration. A p-type silicon substrate grown in accordance with the pulling (Czochralski or CZ) method and an n-type silicon substrate grown in accordance with the floating zone (FZ) method are prepared. Either or both of the surfaces of each substrate are polished into mirror surfaces of 500 Å or less in surface roughness. The two substrates are bonded to each other by putting one polished surface upon the other and then heat-treating the substrates at 1100° C. for one hour. In this bonding process, the crystal lattices of both the substrates roughly match each other. Thereafter, the surface of the n-type semiconductor substrate is mirror polished so that the thickness thereof becomes about 30 μm. Furthermore, boron ions are implanted into the substrate surface to form a p-type well, so that a semiconductor wafer composed of an n-type region (n-type semiconductor substrate) and a p-type region (p-type well) can be obtained. An oxide film is usually interposed between both the regions. In this case, both the regions can be sufficiently insulated by the oxide film with a thickness as thin as 20 to 30 Å. Further, the p-type semiconductor substrate is provided with a gettering function. Thereafter, impurity layers are formed to obtain transistors, in the same way as the device shown in FIG. 1. In this fourth embodiment, it is possible to reverse the conductivity types of these two substrates. In this case, an n-type substrate obtained by the CZ method and a p-type substrate obtained by the FZ method are bonded, and the surface of the p-type FZ substrate is mirror polished to form devices. In these devices, since the device active areas exist on the substrate surface formed by the FZ method, the oxygen concentration thereof is as low as $1 \times 10^{16}$ cm$^{-3}$, so that the occurrence of crystal defects or oxide film defects can be suppressed.

Figure 10:
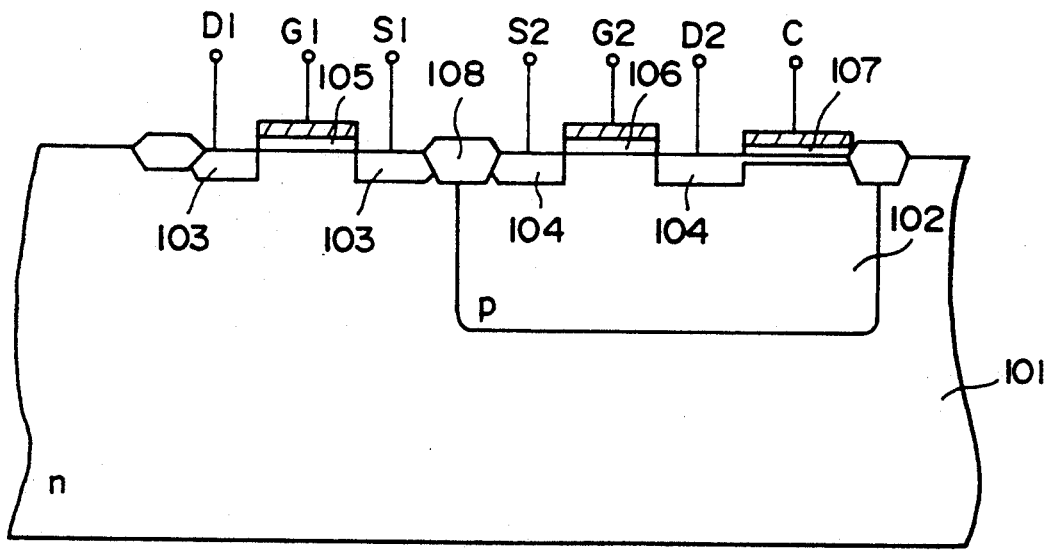
FIG. 10 is a cross-sectional view showing the structure of a prior-art semiconductor device.

The effect of the invention will be described hereinbelow with reference to comparative examples. In the first embodiment, the n-type layer 12 was formed on the p-type semiconductor substrate 11. In contrast, a first comparative example was obtained by forming an n-type semiconductor layer (the same in conductivity type as the substrate) on an n-type semiconductor substrate. The n-type layer was formed by the epitaxial growth method and further a p-type well and p- or n-type impurity layers were formed in the same method as in the first embodiment, to form MOS transistors and a capacitance. A second comparative example was obtained by forming a p-type well and impurity layers on device active areas formed on the surface of a 1–2 ohm-cm n-type semiconductor substrate which corresponds to the prior-art device as shown in FIG. 10, to form MOS transistors and a capacitance. A third comparative example 3 was obtained by using the prior-art device as shown in FIG. 10, in which the conductivity types are reversed in comparison with the second comparative example. In more detail, the device active areas were formed on the surface of a p-type semiconductor substrate to form an n-type well, and MOS transistors and a capacitance were formed on the surface of the p-type semiconductor substrate and in the n-type well, respectively. A fourth comparative example was obtained by forming the device as the second embodiment as shown in FIG. 2, except the distance between the n-type well 23 and the n-type semiconductor substrate 21 was different than between the second embodiment (2 μm) and the fourth comparative example (25 μm).

One hundred semiconductor devices were prepared for each of the first embodiment, and the first and second comparative examples, to effect n+/P junction leak test in the p-type well. FIGS. 4(a), (b) and (c) show the relationship between the frequencies of occurrence of leak current and the current values I obtained when the leak current occurs in the first embodiment and the first and second comparative examples, respectively. These figures indicate that the leak current values I are concentrated at about $1 \times 10^{-12}$ (A) in the first embodiment 1 and the second comparative example 2, thus, resulting in preferable test results. On the other hand, in the first comparative example, leak currents as high as $1 \times 10^{-10}$ to $1 \times 10^{-8}$ (A) flow. This may be due to the fact that the same conductivity (n) type layer is formed on the n-type semiconductor substrate (being different from the first embodiment) and further the substrate is polluted because the n-type layer is formed by the epitaxial growth method.

One hundred semiconductor devices were prepared for each of the first embodiment and the first and second comparative examples, to check the relationship between the frequency of occurrence of the leak current and the intensity of electric field applied to a 10 mm² area oxide film formed in the p-type well. FIGS. 5(a), (b) and (c) show the voltage resistance distributions of the oxide films in the first embodiment and the first and second comparative examples. These figures indicate that the oxide films are excellent in voltage resistance in the first embodiment and the first comparative example. This may be due to the fact that the opposite conductivity type layer of low oxygen concentration is formed on the semiconductor substrate by the epitaxial growth method (being different from the second comparative example) and further the device active areas are formed in this layer, so that the occurrence of oxide film defects was suppressed.

Figure 6:
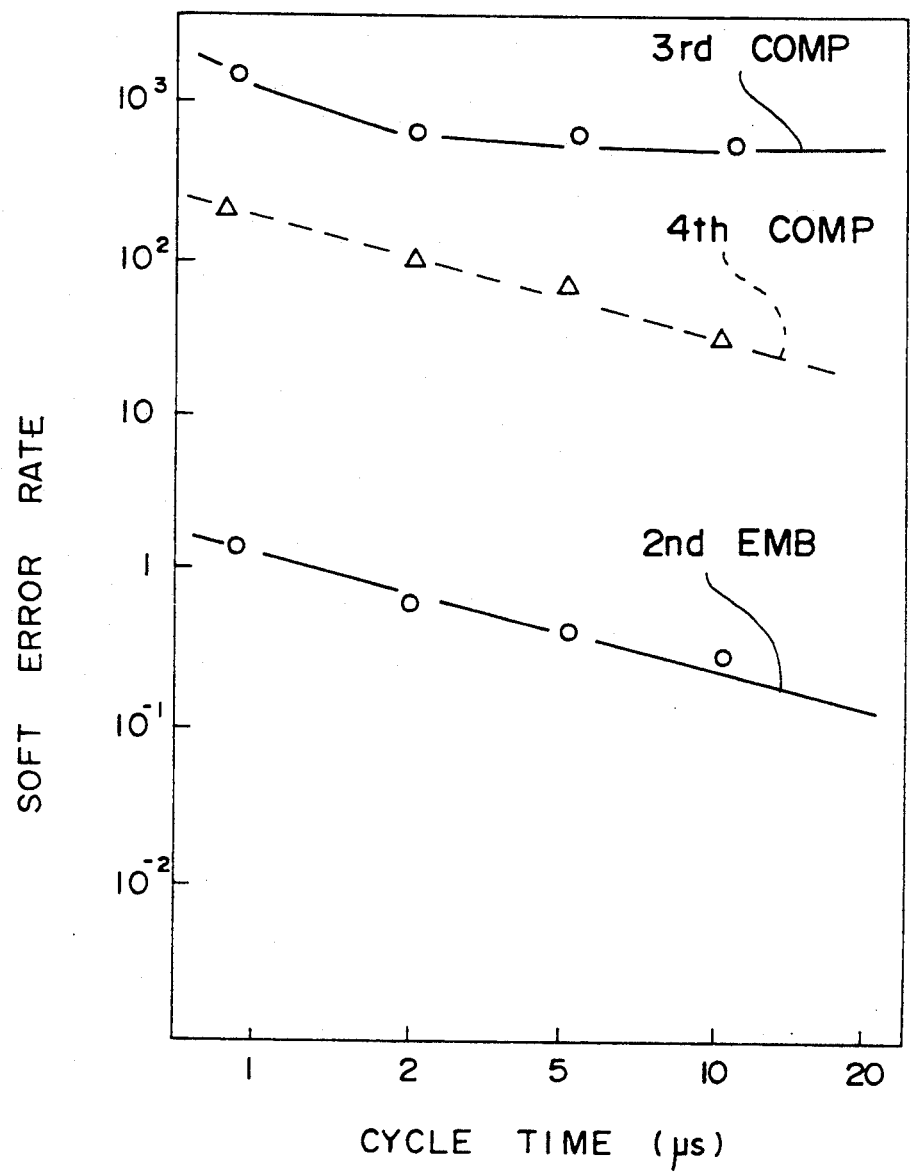
FIG. 6 is a characteristic diagram showing the test results of software error obtained by measuring the invention semiconductor device in comparison with comparative examples.

One hundred pieces of 1 Mbit DRAMs were prepared for each of the second embodiment 2 and the third and fourth comparative examples 3 and 4, in each substrate of which an N-channel MOS transistor and a capacitance were formed on the p-type semiconductor region and a P-channel MOS transistor was formed in the n-type well. FIG. 6 shows the measurement results of the rate of occurrence of software error due to radiant rays obtained by changing the cycle time. FIG. 6 indicates that the software error rate of the second embodiment is markedly improved, that is, reduced to about $10^{-2}$ to $10^{-3}$ times smaller than those of the third and fourth comparative examples. In the fourth comparative example, although the basic substrate structure thereof is the same as that of the second embodiment, the software error rate is not much improved in comparison with the third comparative example 3 of the prior-art substrate structure. This may be due to the fact that the distance between the n-type well and the n-type semiconductor substrate is as much as 25 μm (excessively remote from each other), so that the effect obtained when the p-type layer is formed on the n-type semiconductor substrate is small. In other words, the fourth comparative example is almost the same as when the n-type well is directly formed on the p-type semiconductor substrate. In contrast, if the distance between the n-type well and the n-type semiconductor substrate is 1 μm or less, since the depletion layer extending from the n-type well reaches the n-type semiconductor substrate when the element is in operation, the software error resistance is also reduced, as already described. Therefore, it is preferable that the distance between the two lies within a range from 1 to 20 μm.

Figure 7:
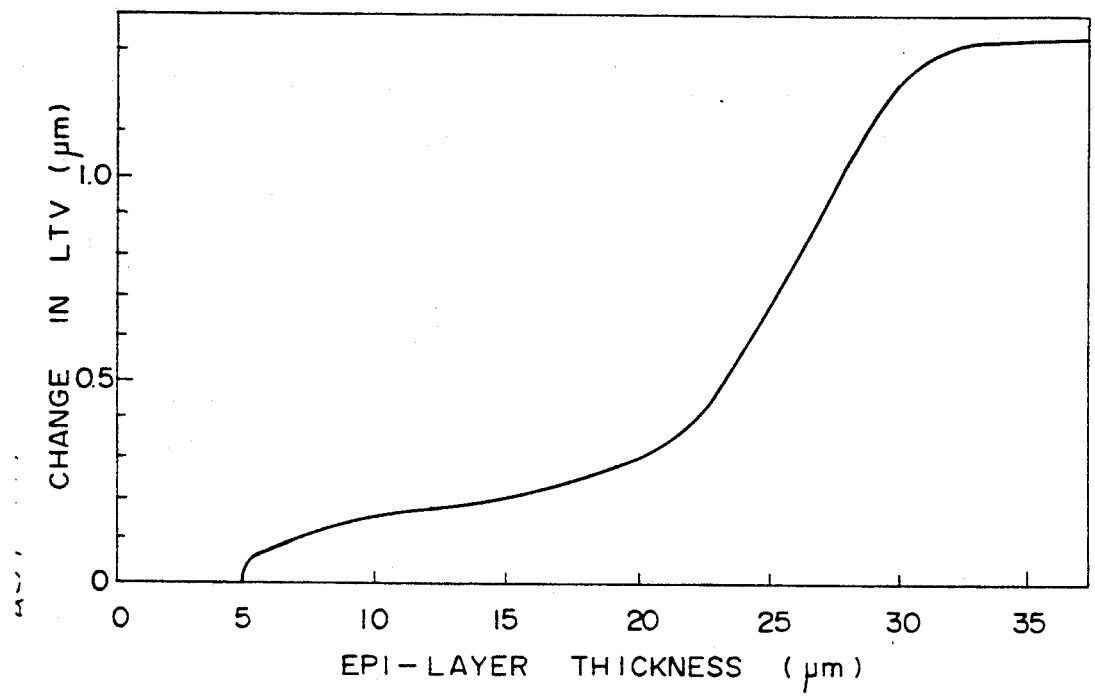
FIG. 7 is a characteristic diagram showing the dependency of epitaxial layer thickness upon a change in LTV.

In the afore-mentioned first to third embodiments, the thickness of the epitaxial layer is 10 μm. However, this thickness is not limited to the above value in the present invention. When an epitaxial layer is formed on a silicon semiconductor substrate, the surface status of the semiconductor substrate changes by the influence thereof. The surfaces of the semiconductor substrate and the semiconductor layer are not necessarily flat but considerably uneven. Therefore, if there exists a LTV (local thickness variation) on the surface area of the semiconductor substrate or layer, since elements cannot be formed precisely at the uneven surface portions, the production yield of the semiconductor device decreases. Accordingly, it is clearly preferable that this LTV is small from the standpoint of semiconductor device manufacture. In this connection, the LTV is determined by obtaining a difference in thickness between the maximum and minimum values within a 17.5 mm square area of a semiconductor substrate. For instance, where the lithography technique is used when elements are formed on the semiconductor substrate, if the LTV is large, there exists a problem in that the focusing process is difficult to perform and therefore process fluctuation occurs. Therefore, it is preferable to minimize the LTV of the semiconductor substrate. At present, it is possible to reduce the LTV down to about 0.8 to 1 μm. FIG. 7 is a characteristic diagram showing the influence of the epitaxial layer thickness upon change in the LTV, in which the ordinate represents change (μm) in the LTV between before and after the epitaxial growth of the wafer, and the abscissa represents thickness (μm) of the epitaxial layer. The change in the LTV indicates a difference in the LTV before an epitaxial layer is grown in a wafer and after the epitaxial layer has been grown in the wafer. Furthermore, in this measurement, semiconductor substrates having a 1 μm or less LTV before the epitaxial layer is formed were adopted. FIG. 7 indicates that the LTV of the wafer changes markedly according to change in the thickness of the epitaxial layer, even if the epitaxial layer is grown in the semiconductor substrate of a small LTV. Although the change in the LTV is not prominent when the thickness of the epitaxial layer is about 20 μm or less, the change in the LTV increases sharply when the thickness increases beyond about 20 μm, and exceeds 0.5 μm when the thickness is about 25 μm, and further increases as much as 1 μm or more when the thickness exceeds 30 μm. That is, when a wafer having an epitaxial layer with a 30 μm or more thickness is used to form an integrated circuit, the wafer will not serve to microminiaturize elements and further the production yield is reduced.

The above-mentioned test results indicate that the semiconductor device according to the present invention is improved with respect to any of junction leak characteristics, oxide film voltage resistance characteristics and software error occurrence rate. Furthermore, when the resistance of the semiconductor substrate is 0.1 ohm-cm or less, it is possible to further reduce the junction leak and the software error rate. This is because oxide film defects and crystal defects decrease at the active area or the semiconductor layer, so that the gettering effect increases on the semiconductor substrate side. To reduce the resistance of the semiconductor substrate down to 0.1 ohm-cm or less as described above, it is necessary to increase the impurity concentration up to at least about $3.5 \times 10^{17}$ cm$^{-3}$ or more in the case of a p-type substrate. In and $2 \times 10^{17}$ cm$^{-3}$ or more in the case of an n-type substrate. In either case, it is possible to increase it up to about $1 \times 10^{20}$ cm$^{-3}$. In the present invention, however, it is not an indispensable condition to limit the impurity concentration of the substrate to within the above-mentioned range. A substrate of about $1 \times 10^{14}$ cm$^{-3}$ in impurity concentration can be used in the present invention. In this case, the substrate resistance is about 100 ohm-cm. Furthermore, the impurity concentration of the low oxygen concentration semiconductor layer formed on the semiconductor substrate is about $5 \times 10^{14}$ to $5 \times 10^{16}$ cm$^{-3}$. The resistance thereof is about 20 to 1 ohm-cm. On the other hand, the junction depth of the well is about 1 to 8 $\mu$m. If the well depth is too shallow, since the depletion layer of the well is connected to that of the channel, the transistor characteristics change. Therefore, it is necessary to prevent the two depletion layers from being connected. However, if excessively deep, since the well expands in the lateral direction of the well during the well forming process, an increase in the well size is not preferable from the standpoint of device microminiaturization. Accordingly, it is preferable that the junction depth lies within the above-mentioned range.

Figure 8:
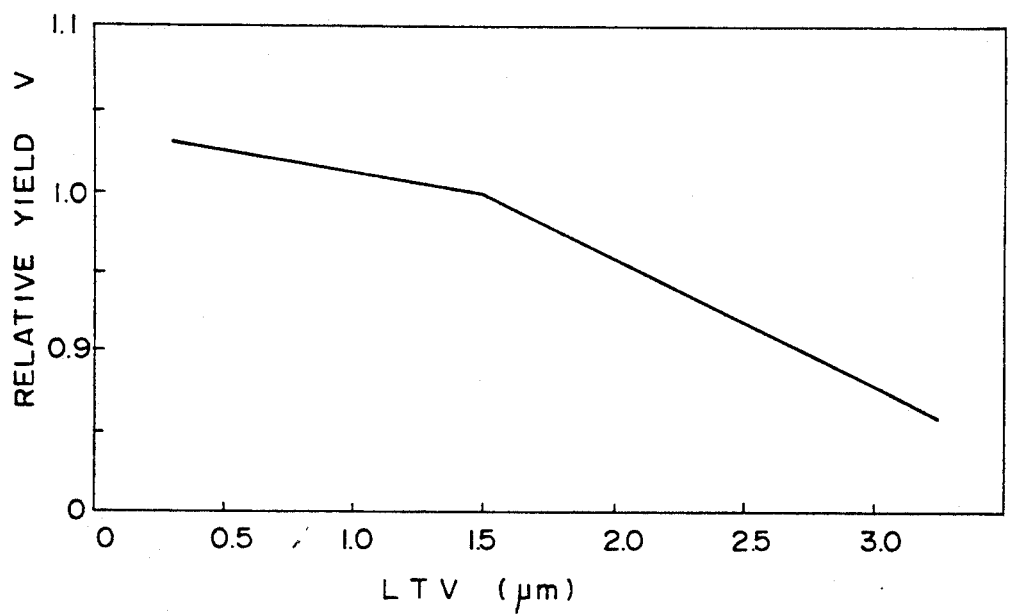
FIG. 8 is a characteristic diagram showing the relationship between the relative yield value and the LTV.

The characteristics of semiconductor devices, such as ICs or LSIs, are largely dependent upon the surface conditions of the wafer. That is, the production yield is largely subjected to the influence of change in the LTV. FIG. 8 is a characteristic diagram showing the dependency of the LTV upon the yield obtained, for instance when 4M dynamic RAMs are formed, in which the ordinate represents the relative yield value and the abscissa represents the LTV value, respectively. The relative yield value can be obtained by comparing yield values obtained when wafers having various LTV values are used to form the memory devices with that obtained when wafers having 1 $\mu$m or less LTVs are used.

FIG. 8 indicates that the relative yield value drops sharply when the LTV exceeds 1.5 $\mu$m. In other words, in the case of a wafer having an LTV change of about 0.5 $\mu$m as shown in FIG. 7, the LTV is about 1.5 $\mu$m. Therefore, if the LTV value increases more than 1.5 $\mu$m, the yield of the semiconductor device drops sharply, as shown in FIG. 8.

Figure 9:
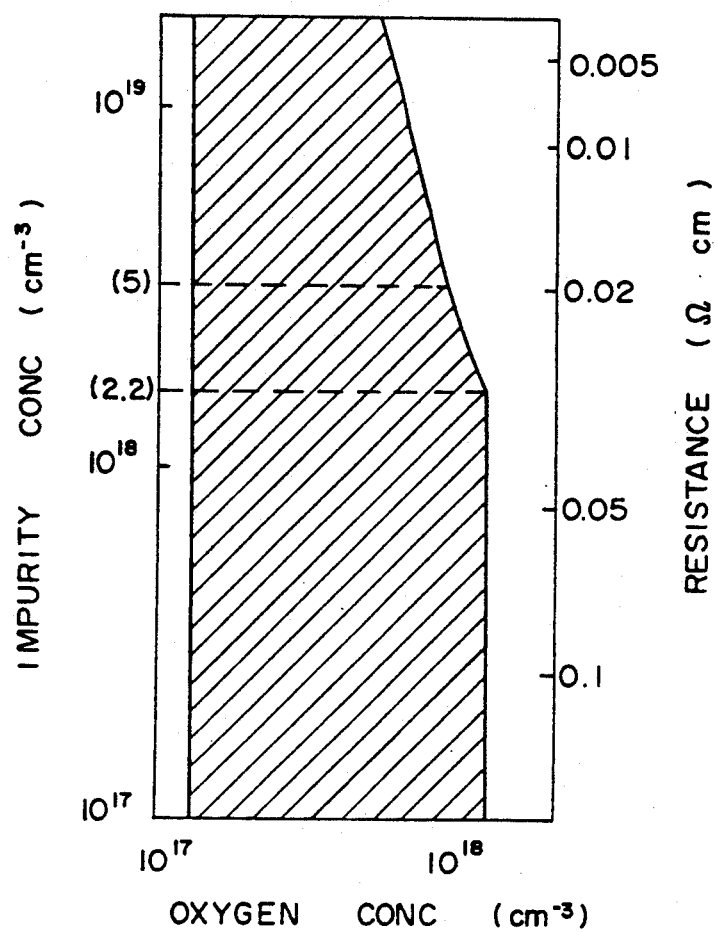
FIG. 9 is a characteristic diagram showing the dependency of oxygen concentration upon impurity concentration within a controllable oxygen concentration range.

As described above, in the device according to the present invention, it is possible to use semiconductor substrate whose impurity concentration lies within such a wide range as from $10^{14}$ to $10^{20}$ cm$^{-3}$. However, the oxygen concentration of the semiconductor substrate is difficult to control, and the controllability is subjected to the influence of the impurity concentration of the semiconductor substrate. FIG. 9 is a characteristic diagram showing the relationship between the controllable oxygen concentration range in a silicon semiconductor substrate and the impurity concentration of the semiconductor substrate, in which the ordinate represents the impurity concentration (cm$^{-3}$) of the semiconductor substrate and the abscissa represents the oxygen concentration (cm$^{-3}$) of the semiconductor substrate.

In FIG. 9, the controllable range of the oxygen concentration is shown by the shaded portion. In this case, p-type silicon substrates obtained by CZ method or MCZ (magnetic field applied Czochralski crystal growth method) are used. FIG. 9 indicates that the controllable oxygen concentration range decreases with increasing impurity concentration; that is, the controllable oxygen concentration range is narrowed when the impurity concentration (the ordinate) exceeds about $2.2 \times 10^{18}$ cm$^{-3}$ and further narrowed sharply when the impurity concentration exceeds $5 \times 10^{18}$ cm$^{-3}$. Furthermore, the controllable range does not change markedly when the impurity concentraton is low (less than $2.2 \times 10^{18}$ cm$^{-3}$)

Furthermore, the intrinsic gettering (IG) is a method of forming microdefects within the wafer to provide a gettering capability to the wafer itself, without depending upon the external operation. In this case, the occurrence of microdefects depends upon the oxygen concentration of the substrate crystal. The oxygen concentration range where the IG is enabled, that is, the BMD (bulk microcrystal defect) controllable range is from about 8 to $12 \times 10^{17}$ cm$^{-3}$ (preferably 8.5 to $11.7 \times 10^{17}$ cm$^{-3}$). In this range, if the impurity concentration is $10^{19}$ cm$^{-3}$ or more, the BMD control is disabled. Further, if the impurity concentration is $5 \times 10^{18}$ cm$^{-3}$ or more, the oxygen concentration range where the IG is enabled is extremely narrowed. Under due consideration of the above, in the present invention, it is preferable to use the semiconductor substrate with an impurity concentration between $1 \times 10^{14}$ cm$^{-3}$ and $5 \times 10^{18}$ cm$^{-3}$.

The embodiments of the present invention have been explained by taking the case of silicon semiconductor, by way of example. Without being limited thereto, however, the present invention can be applied to conventionally well-known semiconductor of germanium or a compound semiconductor. Furthermore, the present invention can be applied to various memory devices, such as a DRM, SRAM, EPROM, etc. and logics, without being limited to a specific device.

What is claimed is:

1. A semiconductor device, comprising:
   a semiconductor substrate;
   a semiconductor layer different in conductivity type from that of said semiconductor substrate, lower in oxygen concentration than said semiconductor substrate, and formed uniformly on said semiconductor substrate;
   a well region different in conductivity type from that of said semiconductor layer and formed into an island shape in said semiconductor layer so that a bottom surface thereof is 1 to 20 $\mu$m away from a surface of said semiconductor substrate; and
   both a MOS-type field effect transistor and a capacitor or either or them formed in said semiconductor layer or said well region so as to be electrically insulated from said semiconductor substrate.

2. The semiconductor device of claim 1, wherein the oxygen concentration of said semiconductor substrate lies within a range from $8 \times 10^{17}$ to $12 \times 10^{17}$ cm$^{-3}$, and that of said semiconductor layer is $3 \times 10^{17}$ cm$^{-3}$ or less.

3. The semiconductor device of claim 1, wherein said semiconductor layer is an epitaxial growth layer, and the thickness thereof is less than 30 $\mu$m.

4. The semiconductor device of claim 1, wherein the impurity concentration of said semiconductor substrate lies within a range from $1 \times 10^{14}$ to $5 \times 10^{18}$ cm$^{-3}$.

5. The semiconductor device of claim 1, wherein the junction depth of said well region lies within a range from 1 to 8 $\mu$m.

6. The semiconductor device of claim 1, wherein two MOS type field effect transistors and a capacitor constitute a memory of a CMOS structure.

* * * * *